(12) United States Patent
Noorbakhsh

(10) Patent No.: US 11,488,806 B2
(45) Date of Patent: Nov. 1, 2022

(54) L-MOTION SLIT DOOR FOR SUBSTRATE PROCESSING CHAMBER

(71) Applicant: APPLIED MATERIALS, INC., Santa Clara, CA (US)

(72) Inventor: Hamid Noorbakhsh, Oakland, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 264 days.

(21) Appl. No.: 16/870,740

(22) Filed: May 8, 2020

(65) Prior Publication Data

US 2021/0351014 A1 Nov. 11, 2021

(51) Int. Cl.
*H01J 37/32* (2006.01)
*H01L 21/677* (2006.01)

(52) U.S. Cl.
CPC .. *H01J 37/32513* (2013.01); *H01J 37/32467* (2013.01); *H01J 37/32743* (2013.01); *H01L 21/67742* (2013.01)

(58) Field of Classification Search
None
See application file for complete search history.

(56) References Cited

U.S. PATENT DOCUMENTS

| | | | | |
|---|---|---|---|---|
| 6,015,465 A | * | 1/2000 | Kholodenko | H01L 21/67248 118/712 |
| 6,071,353 A | * | 6/2000 | Gallagher | C23C 16/4405 216/2 |
| 7,147,424 B2 | * | 12/2006 | Weaver | H01L 21/67772 414/217 |
| 7,575,220 B2 | * | 8/2009 | Tanase | F16K 1/2261 251/303 |
| 2004/0149214 A1 | * | 8/2004 | Hirose | H01L 21/67126 118/715 |
| 2004/0206921 A1 | * | 10/2004 | Blonigan | H01L 21/67126 414/217 |
| 2007/0131167 A1 | * | 6/2007 | Kodashima | H01L 21/6719 156/345.1 |
| 2015/0187542 A1 | * | 7/2015 | Ishida | H01J 37/32513 156/345.1 |
| 2018/0308736 A1 | * | 10/2018 | Ramaswamy | H01L 21/68757 |
| 2019/0348262 A1 | | 11/2019 | Hayasaka et al. | |
| 2021/0193489 A1 | * | 6/2021 | Yang | H01L 21/67196 |
| 2021/0351014 A1 | * | 11/2021 | Noorbakhsh | H01J 37/32467 |
| 2022/0165553 A1 | * | 5/2022 | Noorbakhsh | H01J 37/32467 |

* cited by examiner

*Primary Examiner* — Sylvia MacArthur
(74) *Attorney, Agent, or Firm* — Moser Taboada

(57) ABSTRACT

Embodiments of process kits for use in a process chamber are provided herein. In some embodiments, a process kit includes a slit door having an arcuate profile and including a first plate coupled to a second plate, wherein the first plate is configured to be coupled to an actuator, and wherein the second plate has a processing volume facing surface that includes silicon.

11 Claims, 5 Drawing Sheets

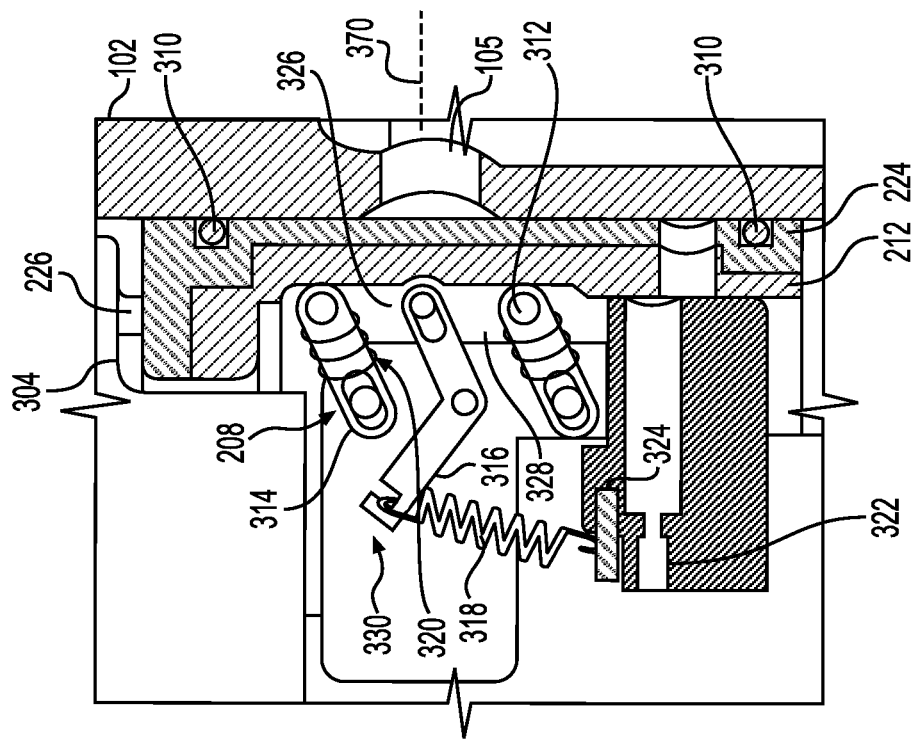
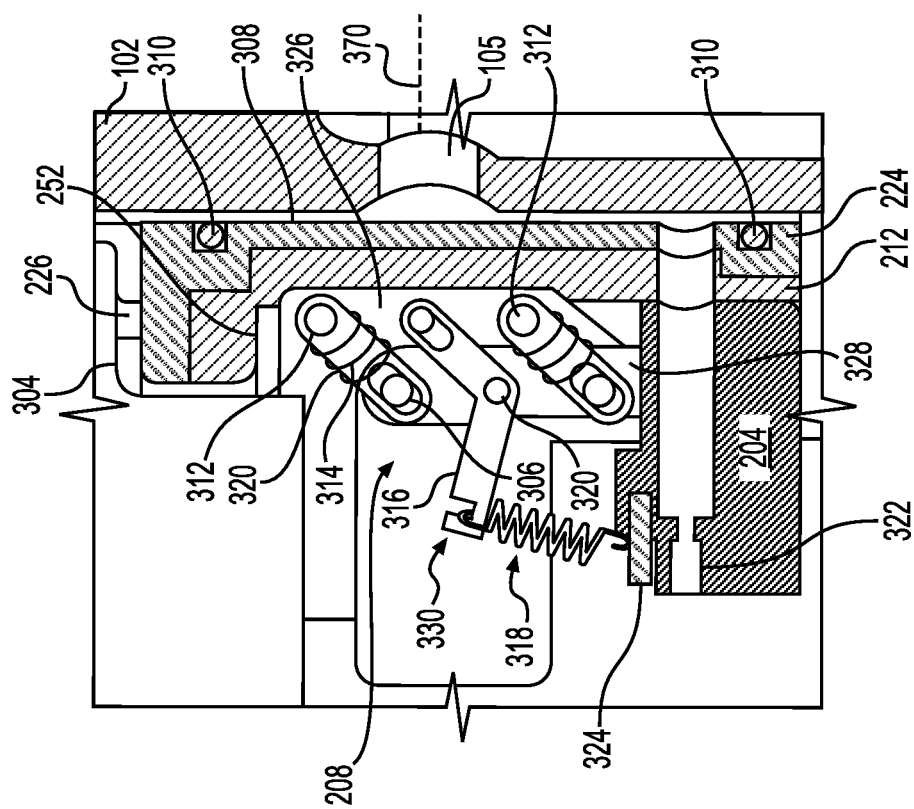

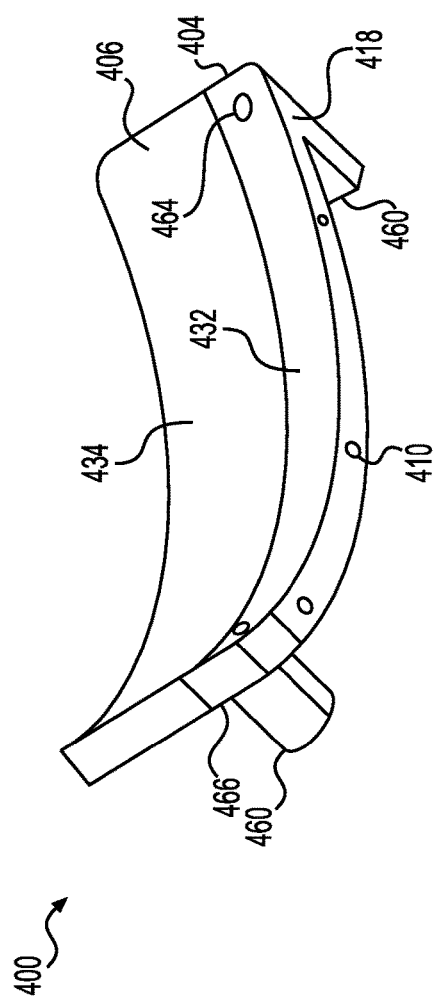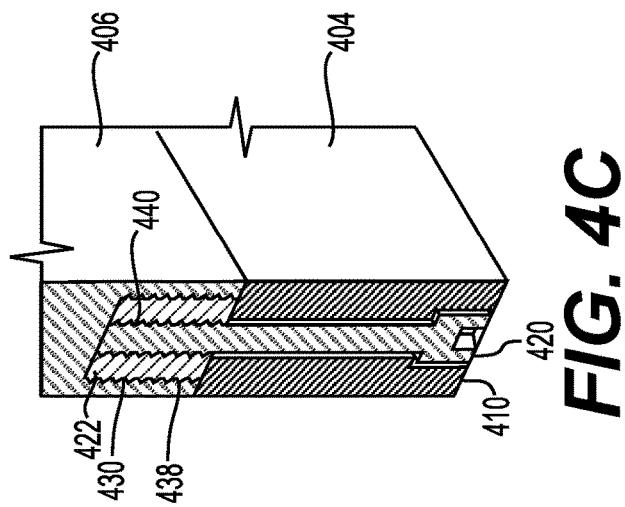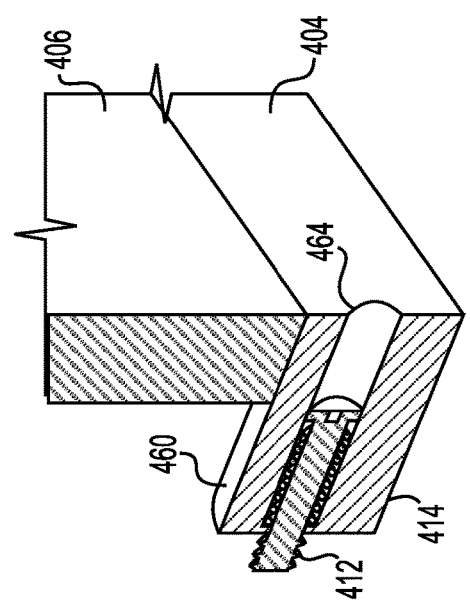

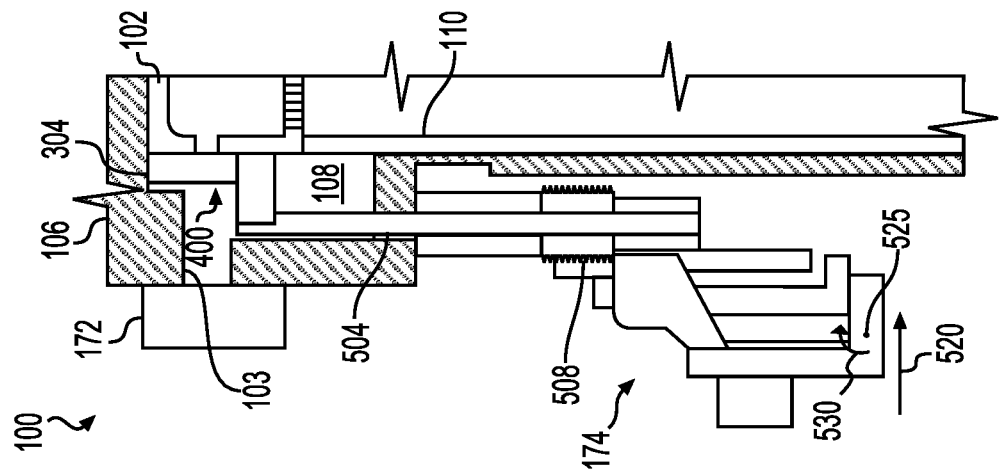
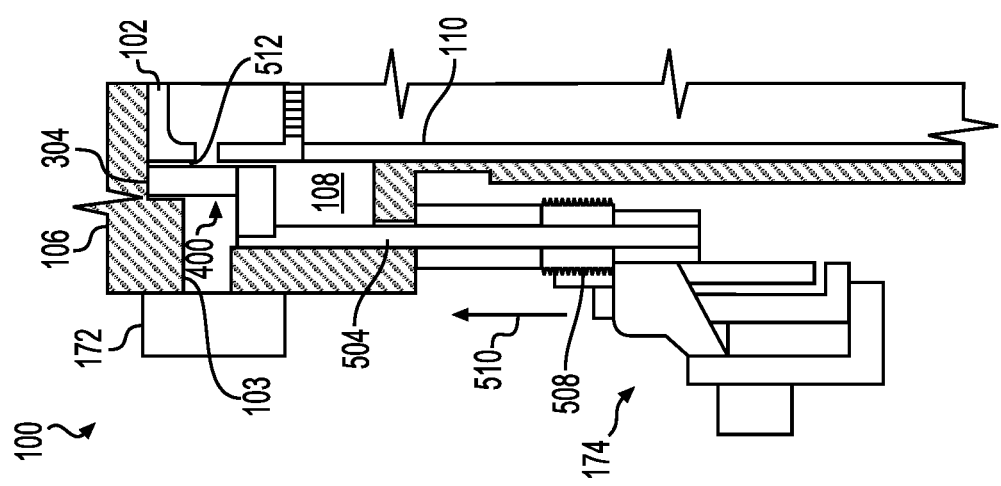
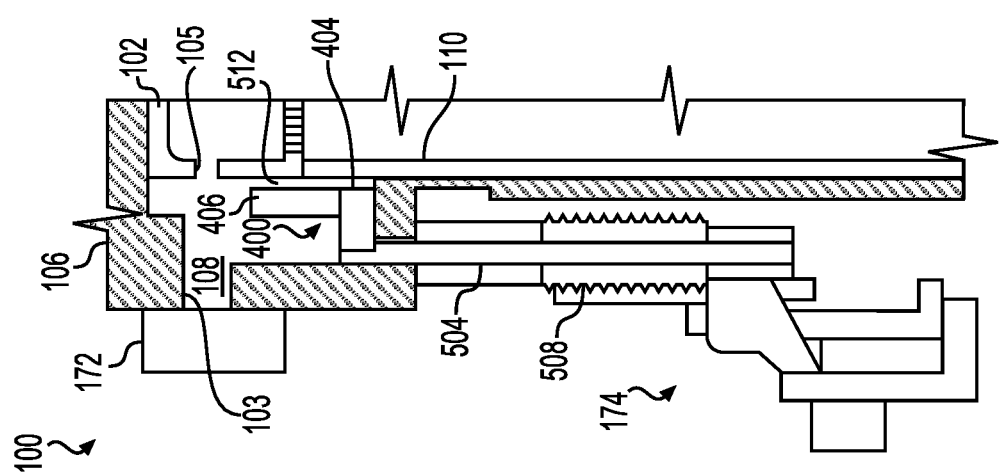

L-MOTION SLIT DOOR FOR SUBSTRATE PROCESSING CHAMBER

FIELD

Embodiments of the present disclosure generally relate to semiconductor processing equipment, and more specifically, to slit doors for use in semiconductor processing equipment.

BACKGROUND

Deposition and etch chambers used in the manufacturing of semiconductor devices need to produce consistent and uniform results for every substrate that is processed. To further enhance processing, plasma can be used in both deposition and etching of materials. The plasma can be generated through inductive coupling or capacitive coupling. In capacitively coupled plasma chambers, conductance liners are used to contain the plasma generated in a process volume of the chamber and to provide an RF ground return path. The conductance liners generally surround the process volume except where interrupted by substrate transfer slots. The substrate transfer slots allow robotic arms to place substrates into and out of the process volume of the plasma chamber. The inventors have observed, however, that the presence of the transfer slot interferes with the uniformity of the deposition on the substrate during processing.

Thus, the inventors have provided improved methods and apparatus that increase deposition uniformity on substrates.

SUMMARY

Embodiments of process kits for use in a process chamber are provided herein. In some embodiments, a process kit includes a slit door having an arcuate profile and including a first plate coupled to a second plate, wherein the first plate is configured to be coupled to an actuator, and wherein the second plate has a processing volume facing surface that includes silicon.

In some embodiments, a slit door assembly for use in a process chamber includes: a process kit having a slit door having an arcuate profile and including a first plate coupled to a second plate, wherein the first plate has one or more legs extending from an outer surface of the first plate, and wherein the second plate has a processing volume facing surface that includes polysilicon; and an actuator coupled to the one or more legs of the first plate and configured to move the slit door in a vertical direction and a horizontal direction.

In some embodiments, a process chamber includes: a chamber body defining an interior volume therein, having an opening extending through sidewalls of the chamber body for transferring a substrate, and having a chamber cavity disposed about the opening on an interior surface of the chamber body; a liner disposed in the interior volume and at least partially defining a processing volume therein, wherein the liner includes a substrate transfer slot aligned with the opening of the chamber body; a slit door having an arcuate profile disposed in the chamber cavity adjacent to the substrate transfer slot; an actuator coupled to the slit door and configured to move the slit door in both a vertical direction and a horizontal direction to selectively seal or expose the substrate transfer slot of the liner; and a substrate support disposed in the interior volume to support a substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3A is a schematic side view of a slit door in a partially closed position in accordance with some embodiments of the present disclosure.

FIG. 3B is a schematic side view of a slit door in a closed position in accordance with some embodiments of the present disclosure.

FIG. 4A is a bottom isometric view of a slit door in accordance with some embodiments of the present disclosure.

FIG. 4B is a cross-sectional view of a portion of the slit door of FIG. 4A in accordance with some embodiments of the present disclosure.

FIG. 4C is a cross-sectional view of a portion of the slit door of FIG. 4A in accordance with some embodiments of the present disclosure.

FIG. 5A is a schematic side view of a slit door in a first position in accordance with some embodiments of the present disclosure.

FIG. 5B is a schematic side view of a slit door in a second position in accordance with some embodiments of the present disclosure.

FIG. 5C is a schematic side view of a slit door in a third position in accordance with some embodiments of the present disclosure.

Figure 1:
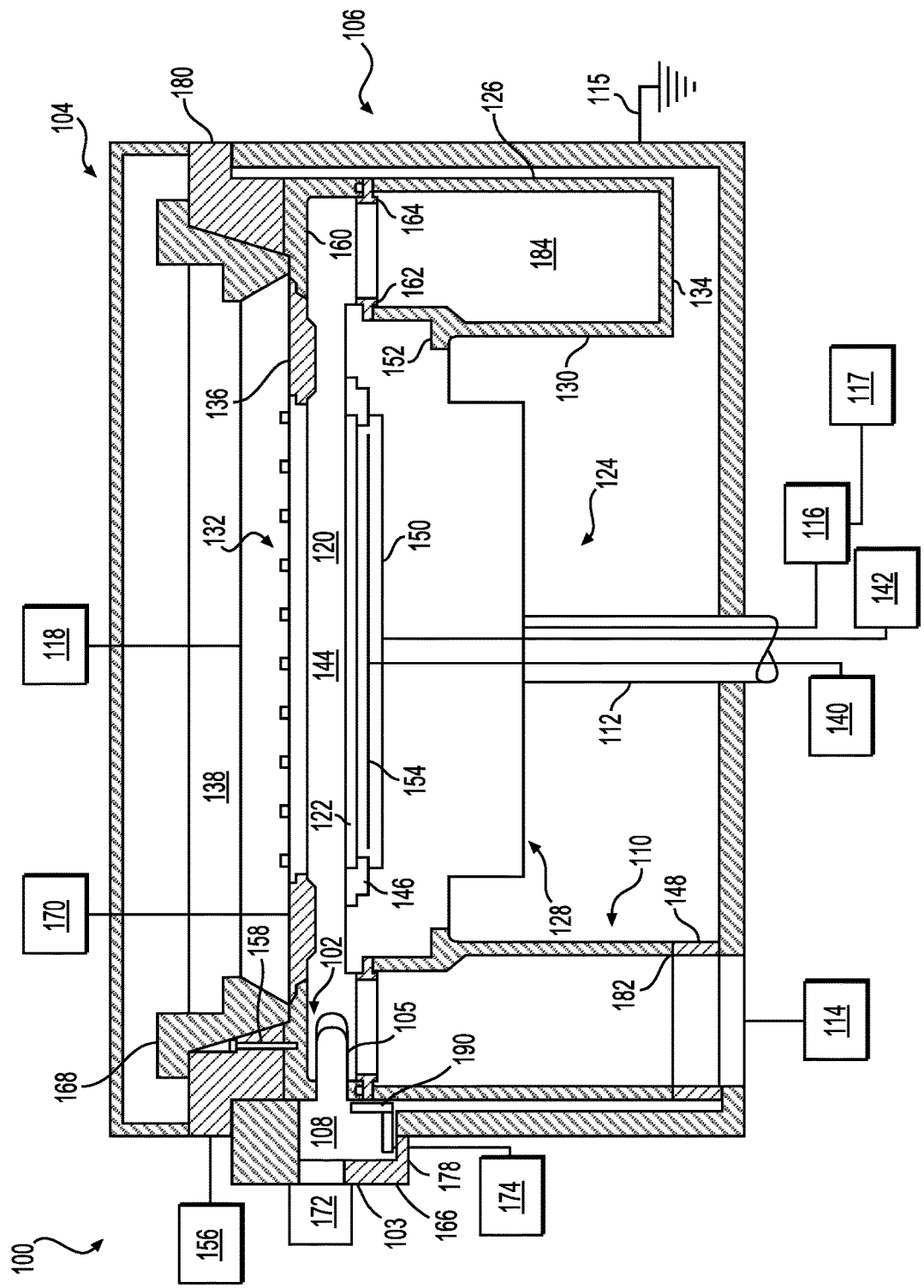
FIG. 1 is a schematic side view of a portion of a process chamber having a slit door in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The apparatus described herein provides improved deposition uniformity in plasma process chambers. Plasma confinement liners facilitate in keeping the plasma within a process chamber's process volume and provide an RF ground return path during processing. The inventor discovered that substrate transfer slots used for placing substrates into and out of the process volume of the process chamber are a major source of uniformity issues as the substrate transfer slot breaches the confinement liner. The substrate transfer slot disrupts the smoothness of the inner surface of the confinement liner and affects the current flow through the confinement liner. Embodiments of slit doors provided herein advantageously selectively seal substrate transfer slots of confinement liners disposed in a process chamber to improve the uniformity of the deposition on the substrate during processing. By selectively sealing the substrate transfer slot, the slit door closes a gap between the slit door and the confinement liner, reducing or preventing plasma light up therebetween. In some embodiments, the slit door is made of a same material as the confinement liner to advantageously provide electrical continuity across the substrate transfer slot. The slit door moves in an L-motion to reduce or prevent generation of unwanted particles through rubbing of chamber components.

FIG. 1 is a schematic side view of a portion of a process chamber having a slit door in accordance with some embodiments of the present disclosure. In some embodiments, the process chamber is an etch processing chamber.

However, other types of processing chambers configured for different processes can also use or be modified for use with embodiments of the liners described herein.

The process chamber 100 is a vacuum chamber which is suitably adapted to maintain sub-atmospheric pressures within an interior volume 120 during substrate processing. The process chamber 100 includes a chamber body 106 having sidewalls and a bottom wall. The chamber body 106 is covered by a lid 104 and the chamber body 106 and the lid 104, together, define the interior volume 120. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 128 and a hollow support shaft 112 for supporting the pedestal 128. The pedestal 128 may include an electrostatic chuck 150. The electrostatic chuck 150 comprises a dielectric plate having one or more electrodes 154 disposed therein. The hollow support shaft 112 provides a conduit to provide, for example, backside gases, process gases, fluids, coolants, power, or the like, to the pedestal 128.

The substrate support 124 is coupled to a chucking power supply 140 and RF sources (e.g., RF bias power supply 117 or RF plasma power supply 170) to the electrostatic chuck 150. In some embodiments, a backside gas supply 142 is disposed outside of the chamber body 106 and supplies heat transfer gas to the electrostatic chuck 150. In some embodiments, the RF bias power supply 117 is coupled to the electrostatic chuck 150 via one or more RF match networks 116. In some embodiments, the substrate support 124 may alternatively include AC or DC bias power.

The process chamber 100 is also coupled to and in fluid communication with a process gas supply 118 which may supply one or more process gases to the process chamber 100 for processing the substrate 122 disposed therein. In some embodiments, a showerhead 132 is disposed in the interior volume 120 opposite the substrate support 124. In some embodiments, the showerhead 132 is coupled to the lid 104. The showerhead 132 and the substrate support 124 partially define a processing volume 144 therebetween. The showerhead 132 includes a plurality of openings to distribute the one or more process gases from the process gas supply 118 into the processing volume 144. The showerhead 132 may be coupled to a temperature control unit 138 to control a temperature of the showerhead 132. In some embodiments, an upper electrode 136 is disposed in the interior volume 120 opposite the substrate support 124 to further define the process volume 144. The upper electrode 136 is coupled to one or more power sources (e.g., RF plasma power supply 170) to ignite the one or more process gases. In some embodiments, the upper electrode 136 comprises silicon.

The process chamber 100 generally includes a process kit to protect chamber components against unwanted deposition or etching. The process kit may include a liner 102, for example a confinement liner, disposed in the interior volume 120 about at least one of the substrate support 124 and the showerhead 132 to confine a plasma therein. In some embodiments, the liner 102 is made of a suitable process material, such as aluminum or a silicon-containing material. For example, the liner 102 may be made of silicon carbide (SiC), single crystal silicon, polysilicon, or a material coated with silicon carbide (SiC) or polysilicon to advantageously reduce contamination on the substrate 122. The liner 102 includes an upper liner 160 and a lower liner 162. The upper liner 160 may be made of any of the materials mentioned above. In some embodiments, the lower liner 162 is made of the same material as the upper liner 160. For example, the upper liner 160 and the lower liner 162 may both be made of polysilicon. In some embodiments, the upper liner 160 is made of a material different than the lower liner 162. For example, in some embodiments, the upper liner 160 is made of aluminum and the lower liner 162 is made of polysilicon or a material coated with polysilicon. In some embodiments, the upper liner 160 is made of silicon carbide (SiC) and the lower liner 162 is made of polysilicon or a material coated with polysilicon. In some embodiments, the upper liner 160 rests on the lower liner 162. In some embodiments, the upper liner 160 and the lower liner 162 are integrally formed. The lower liner 162 extends radially inward from the upper liner 160 to define a C-shaped cross-sectional profile of the liner 102. In some embodiments, an inner diameter of the upper liner 160 is greater than an inner diameter of the lower liner 162.

The lower liner 162 includes a plurality of radial slots 164 arranged around the lower liner 162 to provide a flow path of the process gases to a pump port 148 (discussed below). In some embodiments, the liner 102, along with the showerhead 132 and the pedestal 128, at least partially define the processing volume 144. In some embodiments, an outer diameter of the showerhead 132 is less than an outer diameter of the liner 102 and greater than an inner diameter of the liner 102. The liner 102 includes a substrate transfer slot 105 aligned with an opening 103 in the chamber body 106 for transferring the substrate 122 into and out of the process chamber 100. In some embodiments, the opening 103 has a width of about 14.0 inches to about 20.0 inches. A slit valve 172 is coupled to the chamber body 106 to selectively open or close the opening 103 in the chamber body 106.

The process kit may also include a slit door 190 is disposed between the chamber body 106 and the liner 102. In some embodiments, the chamber body 106 includes a chamber cavity 108 disposed about the opening 103 on an interior surface 166 of the chamber body 106. In some embodiments, the slit door 190 is disposed in the chamber cavity 108 and is configured to move within the chamber cavity 108 to selectively expose or cover substrate transfer slot 105 of the liner 102. The slit door 190 is shaped corresponding to a shape of the liner 102. In some embodiments, the slit door 190 has an arcuate profile corresponding to a curvature of the liner 102. In a first position, as shown in FIG. 1, the slit door 190 is positioned to expose the substrate transfer slot 105 of the liner.

The process chamber 100 includes a slit door assembly comprising the slit door 190 coupled to an actuator 174 to facilitate moving the slit door 190 from the first position to a subsequent position to selectively cover or seal the substrate transfer slot 105. In some embodiments, the actuator 174 is configured to move the slit door 190 vertically. In some embodiments, the actuator 174 is configured to move the slit door 190 vertically and horizontally, for example, in an L-motion. In some embodiments, the actuator 174 extends through a ledge 178 of the chamber body 106 defined by the chamber cavity 108.

In some embodiments, the liner 102 is coupled to a heater ring 180 to heat the liner 102 to a predetermined temperature. In some embodiments, the liner 102 is coupled to the heater ring 180 via one or more fasteners 158. A heater power source 156 is coupled to one or more heating elements in the heater ring 180 to heat the heater ring 180 and the liner 102. In some embodiments, a ceramic ring 168 is disposed between the heater ring 180 and the showerhead 132 to thermally de-couple the heater ring 180 from the showerhead 132.

The process chamber 100 is coupled to and in fluid communication with a vacuum system 114, which includes a throttle valve and a vacuum pump, used to exhaust the process chamber 100. The pressure inside the process chamber 100 may be regulated by adjusting the throttle valve and/or vacuum pump. The vacuum system 114 may be coupled to a pump port 148.

In some embodiments, the liner 102 rests on a lower tray 110. The lower tray 110 is configured to direct a flow of the one or more process gases and processing by-products from the plurality of radial slots 164 to the pump port 148. In some embodiments, the lower tray 110 includes an outer sidewall 126, an inner sidewall 130, and a lower wall 134 extending from the outer sidewall 126 to the inner sidewall 130. The outer sidewall 126, the inner sidewall 130, and the lower wall 134 define an exhaust volume 184 therebetween. In some embodiments, the outer sidewall 126 and the inner sidewall 130 are annular. The lower wall 134 includes one or more openings 182 (one shown in FIG. 1) to fluidly couple the exhaust volume 184 to the vacuum system 114. The lower tray 110 may rest on or be otherwise coupled to the pump port 148. In some embodiments, the lower tray 110 includes a ledge 152 extending radially inward from the inner sidewall 130 to accommodate a chamber component, for example, the pedestal 128 of the substrate support 124. In some embodiments, the lower tray 110 is made of a conductive material such as aluminum to provide a ground path.

In operation, for example, a plasma may be created in the processing volume 144 to perform one or more processes. The plasma may be created by coupling power from a plasma power source (e.g., RF plasma power supply 170) to a process gas via one or more electrodes (e.g., upper electrode 136) near or within the interior volume 120 to ignite the process gas and create the plasma. A bias power may also be provided from a bias power supply (e.g., RF bias power supply 117) to the one or more electrodes 154 within the electrostatic chuck 150 to attract ions from the plasma towards the substrate 122.

A plasma sheath can bend at an edge of the substrate 122 causing ions to accelerate perpendicularly to the plasma sheath. The ions can be focused or deflected at the substrate edge by the bend in the plasma sheath. In some embodiments, the substrate support 124 includes an edge ring 146 disposed about the electrostatic chuck 150. In some embodiments, the edge ring 146 and the electrostatic chuck 150 define a substrate receiving surface. The edge ring 146 may be coupled to a power source, such as RF bias power supply 117 or a second RF bias power supply (not shown) to control and/or reduce the bend of the plasma sheath.

Figure 2A:
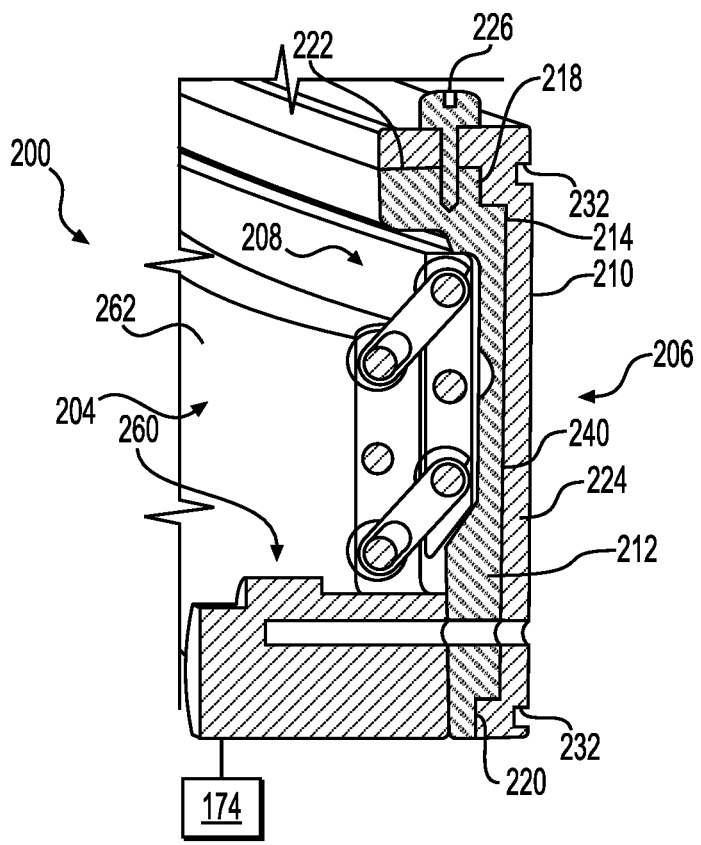
FIG. 2A is a cross-sectional side view of a portion of a slit door in accordance with some embodiments of the present disclosure.

FIG. 2A is a cross-sectional side view of a portion of a slit door 200 in accordance with some embodiments of the present disclosure. In some embodiments, the slit door 200 is the slit door 190 of FIG. 1. In some embodiments, the slit door 200 includes a first plate 204 pivotably coupled to a second plate 206 via a linkage assembly 208 (described in more detail below). In some embodiments, the first plate 204 is pivotably coupled to the second plate 206 on both sides of the first plate 204 via the linkage assembly 208. In some embodiments, the first plate 204 and the second plate 206 are curved. The first plate 204 is coupled to the actuator 174 to move the slit door 200. In some embodiments, the first plate 204 includes one or more legs 260 extending from an outer surface 262 of the first plate 204 away from the second plate 206. The one or more legs 260 are coupled to the actuator 174. The second plate 206 has an inner surface 210 that faces the processing volume 144. In some embodiments, the inner surface 210 is made of the same material as the liner 102. In some embodiments, the inner surface 210 includes one or more channels 232 to accommodate corresponding one or more seals to provide a seal between the slit door 200 and the liner 102.

In some embodiments, the second plate 206 includes a middle plate 212 and a cover plate 224 that is replaceable coupled to the middle plate 212 to cover an inner surface 214 of the middle plate 212. In some embodiments, the cover plate 224 has an L-shaped profile to cover the inner surface 214 and an upper surface 222 of the middle plate 212. In some embodiments, the middle plate 212 includes an upper notch 218 and a lower notch 220 and the cover plate 224 extends into the upper notch 218 and the lower notch 220 to position the middle plate 212 with respect to the cover plate 224. In some embodiments, a minimum thickness of the cover plate 224 from the inner surface 210 to an outer surface 240 of the cover plate 224 is about 0.05 inches to about 0.25 inches. In some embodiments, the cover plate 228 is made of a material having silicon, for example, polysilicon, silicon carbide (SiC), or a material coated with polysilicon or silicon carbide (SiC).

Figure 2B:
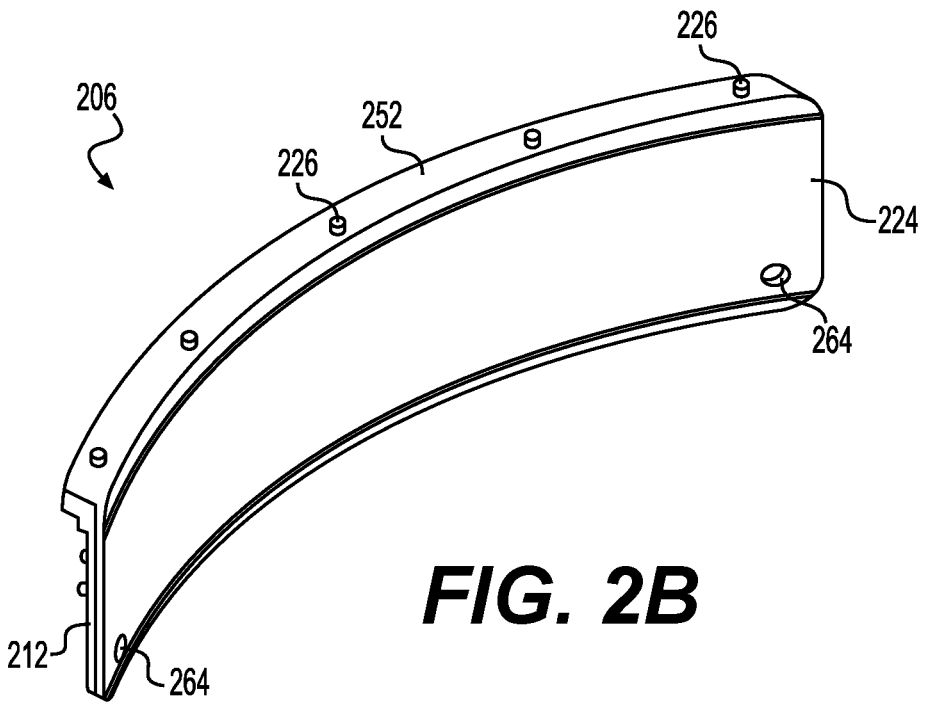
FIG. 2B is an isometric view of a portion of a slit door in accordance with some embodiments of the present disclosure.

FIG. 2B is an isometric view of the second plate 206 of the slit door 200 in accordance with some embodiments of the present disclosure. In some embodiments, the second plate 206 includes bumpers 226 disposed on a top surface thereof. In some embodiments, the cover plate 224 is coupled to the middle plate 212 via the bumpers 226 extending through the cover plate 224 to the upper surface 222 of the middle plate 212. In some embodiments, the bumpers 226 are made of a polymer material, for example, polyether ether ketone. The bumpers 226 are configured to prevent an upper surface 252 of the second plate 206 from contacting the chamber body 106 when the slit door 200 is disposed therein. In some embodiments, the second plate 206 includes one or more openings 264 corresponding with the one or more legs 260 of the first plate 204 to facilitate coupling the first plate 204 to the actuator 174.

FIG. 3A is a schematic side view of the slit door 200 in a second position, or partially closed position, in accordance with some embodiments of the present disclosure. In some embodiments, the actuator 174 moves the slit door 200 vertically upwards from the first position to the second position. The actuator 174 may be coupled to the first plate 204 via an opening 322 in each of the one or more legs 260. In the second position, the slit door 200 contacts a chamber ceiling 304. In some embodiments, a stroke length between the first position and the second position is about 2.5 inches to about 3.5 inches. In some embodiments, the bumpers 226 contact the chamber ceiling 304, so that the upper surface 252 of the second plate 206 does not contact the chamber ceiling 304. A gap 308 between the slit door 200 and the liner 102 while the slit door 200 moves from the first position to the second position advantageously prevents the slit door 200 from rubbing against the liner 102 and generating unwanted particles. In some embodiments, the gap 308 is about 0.02 inches to about 0.2 inches.

In some embodiments, the linkage assembly 208 includes one or more first pins 306 extending from side surfaces 328 of the first plate 204. In some embodiments, the side surfaces 328 are recessed from an outer sidewall of the first plate 204. In some embodiments, the linkage assembly 208 includes one or more second pins 312, corresponding with the one or more first pins 306, and extending from side surfaces 326 of the second plate 206. In some embodiments, the side surfaces 326 are recessed from an outer sidewall of the second plate 206.

In some embodiments, the linkage assembly 208 includes one or more first pivot arms 314 having a first opening at a first end and a second opening at a second end. A set of pins comprising a pin of the plurality of first pins 306 and a pin of the plurality of second pins 312 extend through the first opening and the second opening of each first pivot arm 314, respectively. At least one of the first opening or the second opening is an elongated opening to allow movement of the respective first pin 306 or second pin 312 within each corresponding opening. A compression spring 320 may be disposed about each of the one or more first pivot arms 314 and between each set of pins to urge each pin of the set of pins away from each other. In some embodiments, the linkage assembly 208 includes two first pivot arms 314 and two sets of pins corresponding with the two first pivot arms 314.

In some embodiments, a second pivot arm 316 includes a first opening for a pin of the plurality of first pins 306 to extend therethrough and a second opening for a pin of the plurality of second pins 312 to extend therethrough. The second pivot arm 316 is configured to pivot about the pin of the plurality of second pins 312 extending therethrough. The second opening of the second pivot arm 316 is an elongated opening to allow some movement of the second pin 312 within the second opening.

An extension spring 318 extends from an end 330 of the second pivot arm 316 opposite the second opening to a lower portion of the first plate 204 to draw the end 330 of the second pivot arm 316 downwards, urging the second plate 206 towards the first plate 204. In some embodiments, the extension spring 318 is coupled to one of the one or more legs 260 of the first plate 204. In some embodiments, the extension spring 318 is coupled to a mounting plate 324 that is coupled to the first plate 204. When in the first position and the second position, the force provided by the extension spring 318 urging the second plate 206 towards the first plate 204 is greater than a force provided by the compression springs 320 urging the second plate 206 away from the first plate 204. A line passing through each set of pins comprising a pin of the plurality of first pins 306 and a pin of the plurality of second pins 312 is disposed at an angle with respect a horizontal line 370 passing through the substrate transfer slot 105. In some embodiments, the second pivot arm 316 has a V-shaped or L-shaped profile. In some embodiments, the second pivot arm 316 is disposed between two first pivot arms of the one or more first pivot arms 314.

FIG. 3B is a schematic side view of a slit door in a third position, or closed position, in accordance with some embodiments of the present disclosure. From the second position to the third position, the actuator 174 continues to raise the first plate 204 after the second plate 206 contacts the chamber ceiling 304, causing the one or more first pivot arms 314 and the second pivot arm 316 to rotate, overcoming the force of the extension spring 318, such that the second plate 206 moves away from the first plate 204. In the third position, the second plate 206 contacts the liner 102. The compression spring 320 provide a tensile force to help seal the second plate 206 to the liner 102 in the third position. In some embodiments, seal members 310 may be disposed between the second plate 206 and the liner 102 to enhance sealing or electrical coupling between the second plate 206 and the liner 102. In some embodiments, the second plate 206 is configured to move a horizontal distance of about 0.02 inches to about 0.2 inches from the second position to the third position.

FIG. 4A is a bottom isometric view of a slit door 400 in accordance with some embodiments of the present disclosure. FIG. 4B is a cross-sectional view of a portion of the slit door 400 of FIG. 4A in accordance with some embodiments of the present disclosure. FIG. 4C is a cross-sectional view of a portion of the slit door 400 of FIG. 4A in accordance with some embodiments of the present disclosure. In some embodiments, the slit door 400 is the slit door 190 of FIG. 1. In some embodiments, the slit door 400 includes a second plate 406 disposed on the first plate 404 and coupled to the first plate 404. In some embodiments, an upper surface of the first plate 404 has a profile similar to a profile of a lower surface of the second plate 406 so that an inner surface 432 of the first plate 404 is substantially flush with an inner surface 434 of the second plate 406. In some embodiments, the inner surface 432 of the first plate 404 is slightly recessed from the inner surface 434 of the second plate 406 so that the inner surface 434 of the second plate prevents the inner surface 432 of the first plate 404 from contacting the liner 102. In some embodiments, the inner surface 434 is continuous with no channels or grooves. In some embodiments, the second plate 406 has no through holes.

In some embodiments, the first plate 404 includes one or more alignment pins (not shown) for aligning the first plate 404 with the second plate 406. In some embodiments, the first plate 404 and the second plate 406 having a gasket therebetween configured to enhance electrical conductivity between the first plate 404 and the second plate 406. In some embodiments, the first plate 404 is made of metal such as aluminum. In some embodiments, the second plate 406 is made of any of the materials discussed above with respect to the cover plate 224. In some embodiments, a height of the second plate 406 is greater than a height of the first plate 404. The second plate 406 is sized so that the height is greater than a height of the substrate transfer slot 105. In some embodiments, the height of the second plate 406 is about 2.0 inches to about 3.0 inches. In some embodiments, the height of the first plate is about 0.5 inches to about 2.0 inches. In some embodiments, a height of the slit door 400 is about 3.0 inches to about 4.0 inches.

In some embodiments, the first plate 404 includes holes 410 extending from a bottom surface 418 to a top surface thereof. The first plate 404 may be coupled to the second plate 406 via fasteners 420 extending through the holes 410 into openings 438 disposed in the second plate 406. In some embodiments, an insert 422 is disposed in each of the openings 438 in the second plate 406 to protect a structural integrity of the second plate 406. In some embodiments, the insert 422 includes a threaded central opening 440 to receive the fasteners 420. The insert 422 may be threaded into, press fit, or otherwise secured within the openings 438 in the second plate 406. In some embodiments, an outer surface 430 of the insert 422 is threaded. The insert 422 may be made of a polymer material, for example, polyether ether ketone.

In some embodiments, one or more legs 460 extend from an outer surface 466 of the first plate 404. The one or more legs 460 (2 shown in FIG. 4A) are configured to couple the first plate 404 to the actuator 174. In some embodiments, the first plate 404 includes an opening 464 from the inner surface 432 of the first plate 404 through each of the one or more legs 460 to accommodate a fastener 412 for coupling the first plate 404 to the actuator 174. In some embodiments, a spring 414 is disposed about the fastener 412 to create a fastener 412 that is spring-loaded to facilitate better contact between the slit door 400 and the liner 102 when in the third position (e.g., FIG. 5C below). In some embodiments, the one or more legs 460 comprises two legs and the first plate 404 is coupled to the second plate 406 via three holes 410 disposed between the two legs.

FIG. 5A is a schematic side view of a slit door in a first position in accordance with some embodiments of the present disclosure. The slit door may be slit door 200 or slit door 400, as shown in FIG. 5A. The slit door 400 advantageously has minimal moving parts within the chamber cavity 108, thereby reducing the generation of unwanted particles. In the first position, the slit door 400 is disposed below the substrate transfer slot 105, exposing the substrate transfer slot 105 to the opening in the chamber body 106. In the first position, there is a gap 512 between the slit door 400 and the liner 102. In some embodiments, the gap 512 is about 0.02 inches to about 0.2 inches. In some embodiments, the actuator 174 includes having one or more shafts 504 and a bellows 508 disposed about each shaft 504 to facilitate moving the shaft 504 in a vertical direction 510. In some embodiments, the one or more shafts 504 are two shafts. In some embodiments, the actuator 174 includes a double acting air cylinder capable of moving the one or more shafts 504 in unison in both a vertical direction and a horizontal direction.

FIG. 5B is a schematic side view of the slit door 400 in a second position in accordance with some embodiments of the present disclosure. The gap 512 between the slit door 400 and the liner 102 is substantially maintained while the slit door 400 moves from the first position to the second position, advantageously preventing the slit door 400 from rubbing against the liner 102 and generating unwanted particles. In some embodiments, in the second position, the slit door 400 contacts the chamber ceiling 304. In some embodiments, from the first position to the second position, the slit door 400 moves towards the chamber ceiling 304 without contacting the chamber ceiling 304. In some embodiments, slit door 400 is configured to move a vertical distance of about 2.5 inches to about 3.5 inches from the first position to the second position.

FIG. 5C is a schematic side view of the slit door 400 in a third position in accordance with some embodiments of the present disclosure. From the second position to the third position, the actuator 174 moves the one or more shafts 504, and the slit door 400 coupled thereto, in a horizontal direction 520 towards the liner 102. In some embodiments, the actuator 174 is configured to move the slit door 400 laterally in the horizontal direction 520. In some embodiments, the actuator 174 is configured to pivot about a pivot axis 525 in a rotational direction 530 to move the slit door 400 in the horizontal direction 520. In some embodiments, the pivot axis 525 is disposed at a lower portion of the actuator 174. In some embodiments, the slit door 400 is configured to move a horizontal distance of about 0.1 inches to about 0.2 inches to close the gap 512 and sealingly engage the liner 102. In some embodiments, the spring 414 disposed about the fastener 412 urges the slit door 400 against the liner 102 to provides a better seal between the slit door 400 and the liner 102 when in the third position.

While the foregoing is directed to embodiments of the present disclosure, other and further embodiments of the disclosure may be devised without departing from the basic scope thereof.

The invention claimed is:

1. A process kit for use in a process chamber, comprising:
a slit door having an arcuate profile and including a first plate coupled to a second plate, wherein the first plate is configured to be coupled to an actuator, and wherein the second plate has a processing volume facing surface that includes silicon, wherein the second plate is disposed on the first plate and coupled to the first plate via fasteners extending through the first plate and into openings in the second plate, and further comprising an insert disposed in each of the openings in the second plate, wherein the insert includes a threaded central opening to receive the fasteners.

2. The process kit of claim 1, wherein one or more legs extend from an outer surface of the first plate, and the first plate includes an opening from an inner surface of the first plate through each of the one or more legs to accommodate a fastener for coupling the first plate to the actuator.

3. The process kit of claim 1, wherein the second plate is entirely made of polysilicon or silicon carbide (SiC).

4. The process kit of claim 1, wherein a height of the second plate is about 2.0 inches to about 3.0 inches.

5. A process kit for use in a process chamber, comprising:
a slit door having an arcuate profile and including a first plate coupled to a second plate, wherein the first plate is configured to be coupled to an actuator, and wherein the second plate has a processing volume facing surface that includes silicon, wherein the second plate includes a middle plate and a cover plate covering an inner surface of the middle plate, wherein an inner surface of the cover plate is the processing volume facing surface of the second plate, and wherein the cover plate is coupled to the middle plate via a plurality of fasteners extending through the cover plate to an upper surface of the middle plate.

6. The process kit of claim 5, wherein middle plate includes an upper notch and a lower notch, and the cover plate extends into the upper notch and the lower notch.

7. The process kit of claim 5, wherein the first plate is pivotably coupled to the second plate on both sides of the first plate via one or more first pivot arms having a compression spring disposed about each of the one or more first pivot arms.

8. A slit door assembly for use in a process chamber, comprising:
a process kit having a slit door having an arcuate profile and including a first plate coupled to a second plate, wherein the first plate has one or more legs extending from an outer surface of the first plate, and wherein the second plate has a processing volume facing surface that includes silicon, wherein the second plate is disposed on the first plate and coupled to the first plate via fasteners extending through the first plate and into openings in the second plate, and wherein an insert made of a polymer is disposed in each of the openings in the second plate, wherein the insert includes a threaded central opening to receive the fasteners; and an actuator coupled to the one or more legs of the first plate and configured to move the slit door in a vertical direction and a horizontal direction.

9. The slit door assembly of claim 8, wherein the first plate is made of aluminum and the second plate is made of polysilicon, silicon carbide (SiC), or a material coated with polysilicon or silicon carbide (SiC).

10. The slit door assembly of claim 8, wherein the actuator includes a double acting air cylinder capable of moving the slit door in both a vertical direction and a horizontal direction.

11. The slit door assembly of claim 8, wherein the actuator is configured to pivot about a pivot axis to move the slit door in the horizontal direction.

\* \* \* \* \*